United States Patent [19]

Locati

[11] Patent Number: 5,368,491
[45] Date of Patent: Nov. 29, 1994

[54] HIGH DENSITY ELECTRICAL CONNECTOR

[75] Inventor: Ronald P. Locati, Harrisburg, Pa.

[73] Assignee: The Whitaker Corporation, Wilmington, Del.

[21] Appl. No.: 169,453

[22] Filed: Dec. 17, 1993

[51] Int. Cl.⁵ .............................................. H05K 1/00
[52] U.S. Cl. ..................................... 439/62; 439/717; 439/115; 439/840
[58] Field of Search ............... 439/289–293, 439/717, 62, 65, 115, 840, 841, 709–714

[56] References Cited

U.S. PATENT DOCUMENTS

| | | | |
|---|---|---|---|
| 4,969,824 | 11/1990 | Casciotti | 439/62 |
| 5,118,299 | 6/1992 | Burns et al. | 439/290 |
| 5,171,154 | 12/1992 | Casciotti et al. | 439/67 |
| 5,176,530 | 1/1993 | Reylek et al. | 439/291 |
| 5,251,106 | 10/1993 | Hui | 439/292 |
| 5,306,171 | 4/1994 | Marshall | 439/291 |

*Primary Examiner*—David L. Pirlot
*Attorney, Agent, or Firm*—William B. Noll

[57] ABSTRACT

This invention hereof is directed to a high density electrical connector utilizing a flexible film having etched circuitry thereon for electrically interconnecting to conductive traces or pads on at least a pair of planar electronic devices. The connector includes a pair of opposed housing members, where each housing member comprises a plurality of aligned housing segments. The segments are characterized by a pair of end walls and at least a pair of planar sides containing plural, parallel grooves for receiving coiled springs therein, where the springs are positioned to apply a normal force to the overlying flexible film. An improved feature thereof is the provision that each housing segment is arranged in end-to-end relationship with another segment such that the respective grooves are aligned to define a continuous groove between adjacent, aligned segments, and that the end walls are profiled to present a sawtoothed configuration which when arranged together interfit to form an essentially continuous planar side. Further, by this construction, the end wall junction within a groove between adjacent segments is angularly disposed relative to the axis of the grooves. The coiled springs are arranged within the grooves so that the convolutions thereof are oppositely angled to that of the angle of the junction within the groove.

8 Claims, 4 Drawing Sheets

HIGH DENSITY ELECTRICAL CONNECTOR

BACKGROUND OF THE INVENTION

This invention is directed to a high density electrical connector utilizing a flexible film having etched circuitry thereon for electrically interconnecting to conductive traces or pads on at lease a pair of planar electronic devices, such as arranged at right-angle, mother/daughter-board fashion or in stacking styles for parallel board connection.

The architecture of complex computers, business machines, communication systems has largely developed around the use of a backplane, or mother board, which interconnects multiple daughter boards or cards carrying functioning components designed to define a host of memory and logic functions and the necessary electrical components to effect a signal generation and transmission. Various circuit paths on backpanel and daughter card are interconnected, typically through connectors which engage such circuit paths mechanically with a normal force between contact surfaces sufficient to establish a stable, low-resistance electrical path. Increasing circuit complexity has led to an increase in contact density to a point where hundreds of circuit paths must be interconnected between a given daughter card and a backplane, there being numerous daughter cards associated with a given backplane. This, in turn, has created mechanical problems in that the cumulative normal forces required to effect such an interconnection sometimes exceed 50 or 80 lbs. per card, per side of the card, and all are on extremely close centers, frequently in multiple rows on a given side of a card to require extremely accurate dimensions of the boards, connectors, contacts and the like. A still further problem has to do with the surface finishes of the contacts of connectors which may be contaminated in inventory or in handling and cause a variability in resistance between paths which, in the presence of high speed signal pulses transmitted therethrough alter the resistance and impedance of the circuit paths to a detriment of circuit function.

U.S. Pat. No. 5,171,154 represents a major effort to achieve a high density interconnection with high speed signal capability. A commercial system is described in Product Information Bulletin 65188 under the heading, "AMP-ASC INTERCONNECTION SYSTEMS," copyright 1991 by AMP Incorporated. A right-angle, backplane described therein shows a plurality of aligned spring carrier segments, where an essentially continuous groove running along the face of such segments includes plural, parallel grooves each containing a single canted coil spring. Typically, the segments are stacked alongside one another over a structural core member. A small gap normally exits between adjacent segments whereby the contained coiled spring can be trapped affecting proper spring operation, and ultimately causing connector performance problems. To overcome such problems, a thin metallic shim is normally placed into each spring groove or channel to bridge the small gaps. Thereafter, the springs are placed on top of the shim, whereby the shim provides an even, uninterrupted floor for the spring.

By a unique construction, the present invention achieves the goals of high density, high speed signal capability and simplicity in operation. This will become apparent in the specification which follows, particularly when read in conjunction with the accompanying drawings.

SUMMARY OF THE INVENTION

This invention is directed to a high density electrical connector utilizing a flexible film having etched circuitry thereon for electrically interconnecting to conductive traces or pads on at least a pair of planar electronic devices. The connector includes a pair of opposed housing members, where each housing member comprises a plurality of aligned housing segments. The segments are characterized by a pair of end walls and at least a pair of planar sides containing plural, parallel grooves for receiving coiled springs therein, where the springs are positioned to apply a normal force to the overlying flexible film. An improved feature thereof is the provision that each housing segment is arranged in end-to-end relationship with another segment such that the respective grooves are aligned to define a continuous groove between adjacent, aligned segments, and that the end walls are profiled to present a sawtoothed configuration which when arranged together interfit to form an essentially continuous planar side. Further, by this construction, the end wall junction within a groove between adjacent segments is angularly disposed relative to the axis of the grooves.

DETAILED DESCRIPTION OF PREFERRED EMBODIMENT

The present invention is directed to an improved housing assembly for supporting and electrically interconnecting a pair of planar electronic devices arranged at a right angle to one another. Specifically, this invention relates to plural housing segments arranged to form a housing member for a board-to-board connector assembly.

Figure 1:
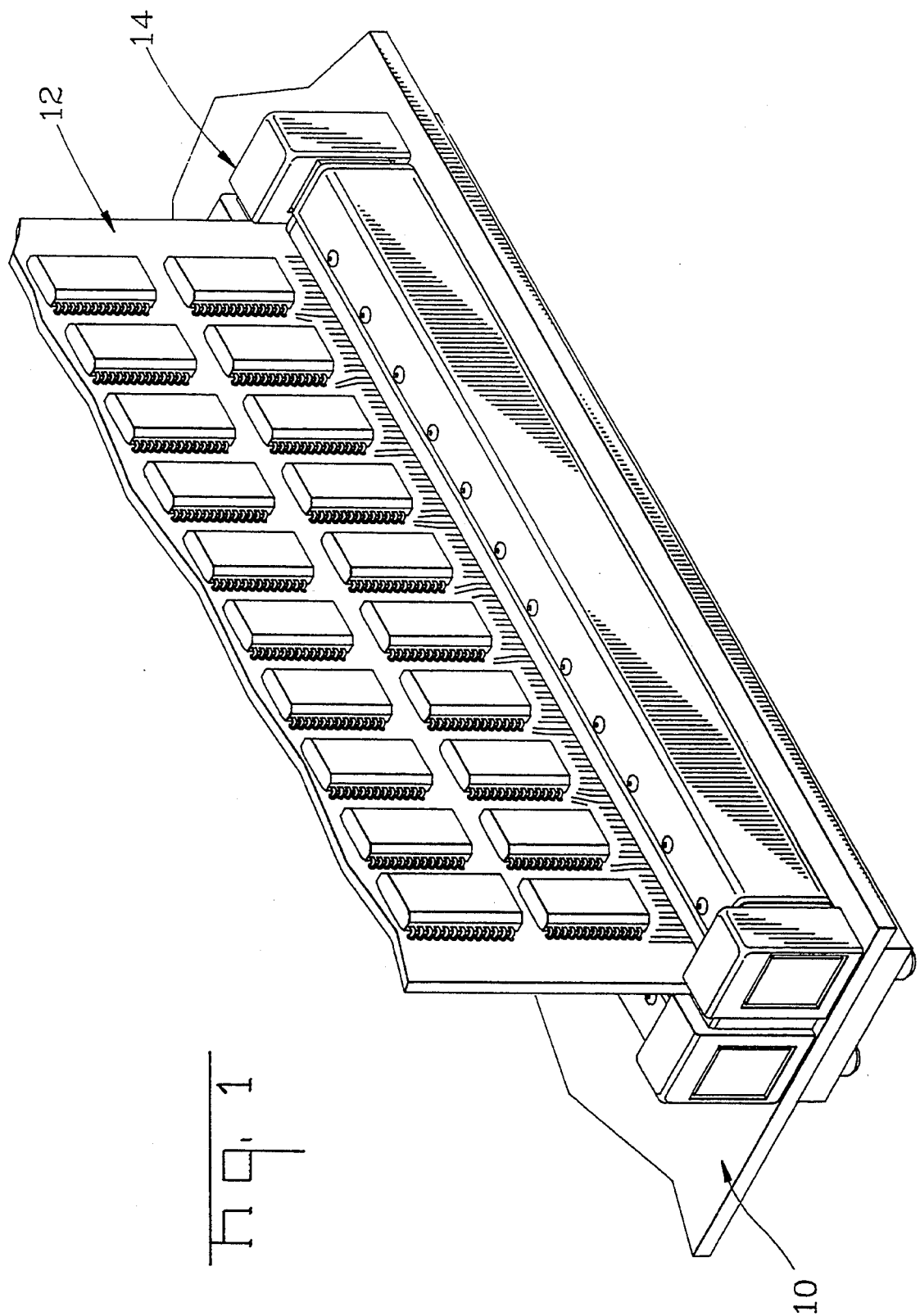
FIG. 1 is a perspective view of a right angle, backplane connector for electrically interconnecting a mother board to a daughter board, where the opposed housings, mounted to the mother board, may incorporate the inventive features of this invention.

FIG. 1 illustrates a typical connector for which the present invention may apply. Specifically, the assembly thereof includes a pair of planar electronic devices, such as a mother board 10 and a daughter board 12, and a connector housing assembly 14 for receiving and applying a normal force to the daughter board 12 received therein. FIGS. 2-5 illustrate more clearly the construction features of a modified connector housing assembly for use in the connector 20 of this invention.

Figure 3:
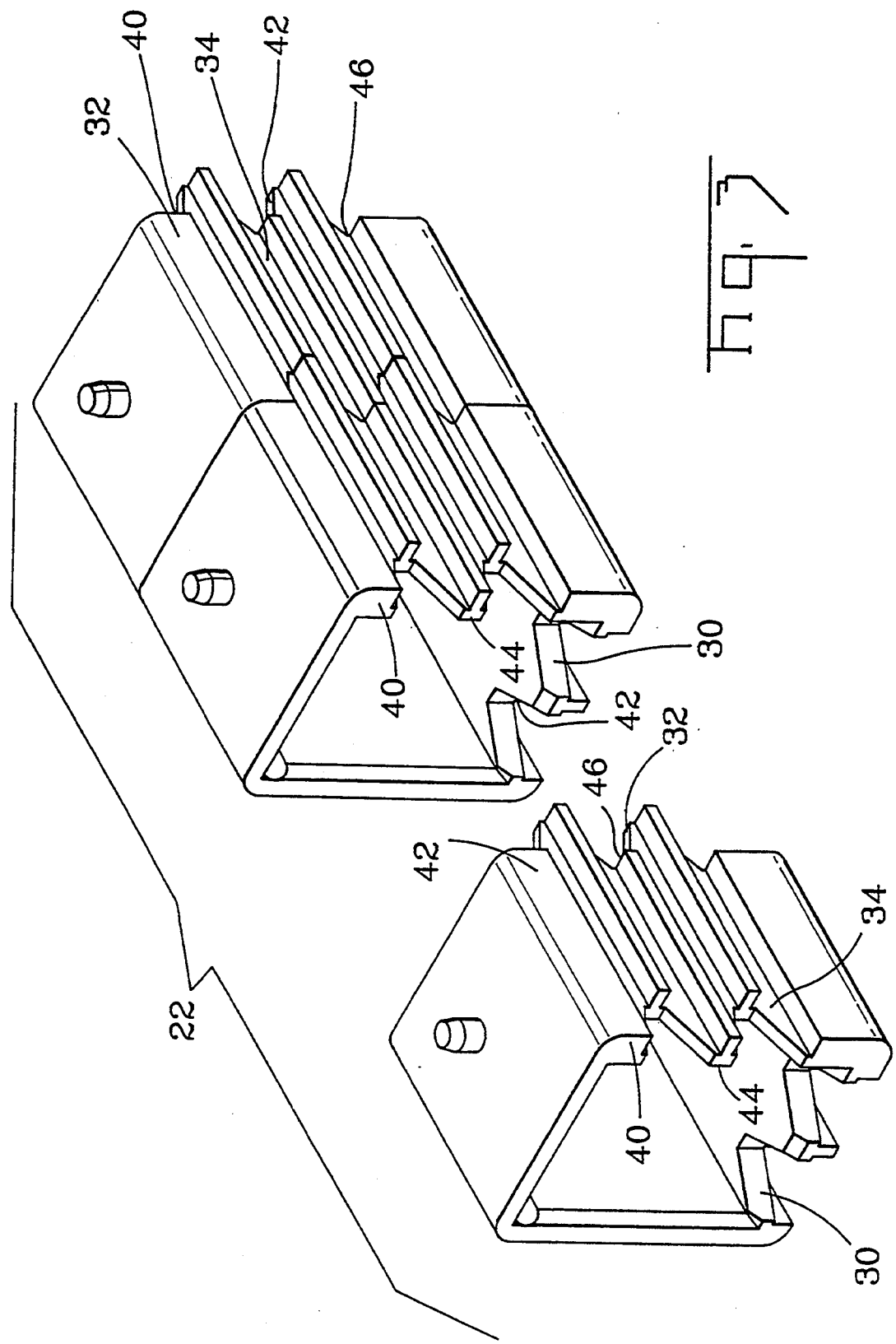
FIG. 3 is an enlarged perspective view of plural housing segments, showing a pair of such housings aligned and intermated, and a third housing segment aligned but exploded therefrom.
Figure 4:
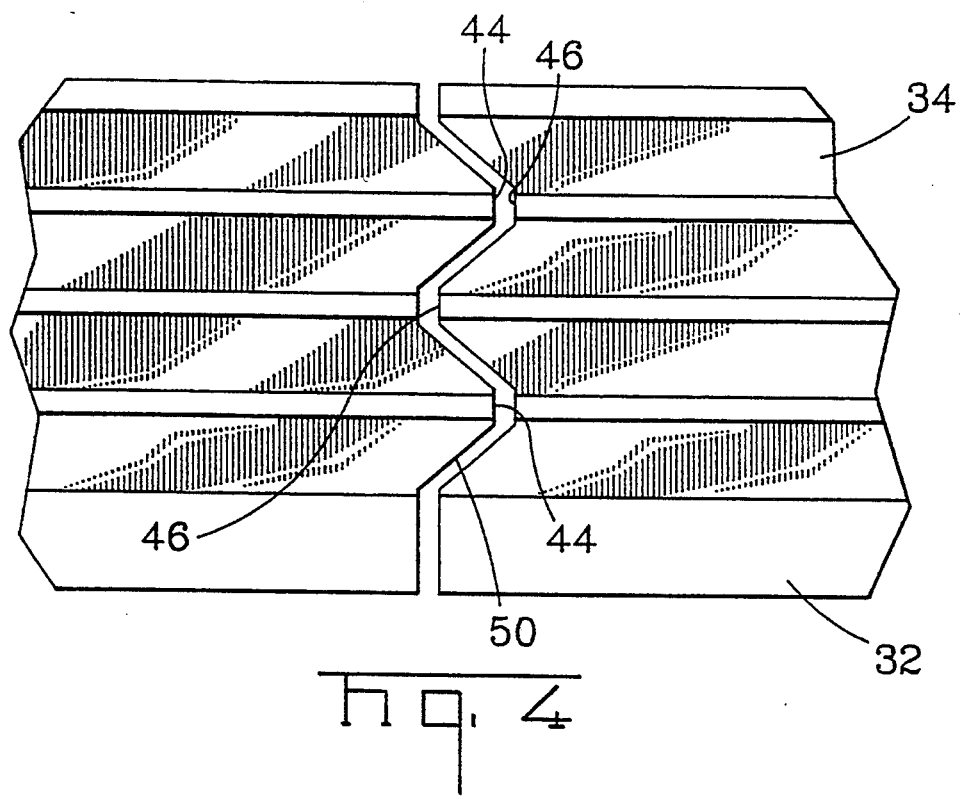
FIG. 4 is a front view of the pair of aligned and intermated housing segments of FIG. 3.
Figure 5:
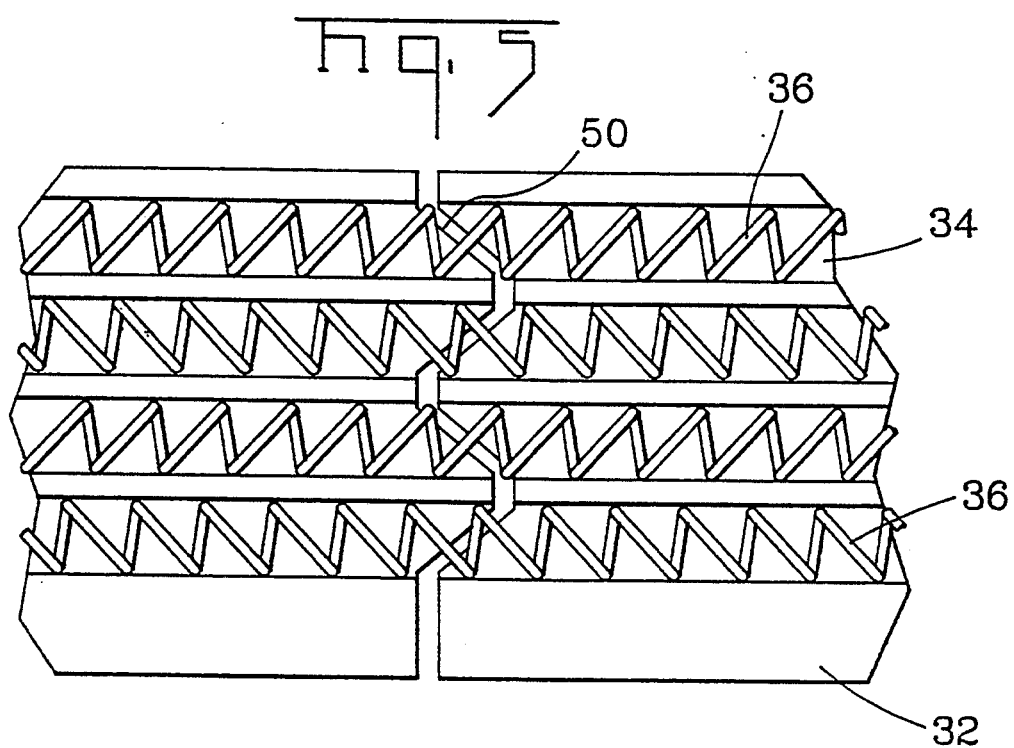
FIG. 5 a view similar to FIG. 4 but showing plural canted coiled springs arranged within the like plurality of aligned slots or channels.

The connector 20 of this invention comprises a plurality of housing segments 22, illustrated in detail in FIGS. 3-5, a rigid central core member 24 for slidably receiving said housing segments 22 in aligned relationship, and end housings 26 for securing the connector 20 to an underlying planar electronic device, such as a mother board, as known in the art.

Turning now to a more detailed discussion of the modular housing segments 22 illustrated in FIGS. 3-5, it will be seen that such segments comprise a generally rectangular member consisting of four walls, where a pair of such walls, namely, bottom 30 and front face 32, are provided with plural, parallel channels or grooves 34 for receiving therein a coiled spring 36, see FIG. 5. As best seen in FIG. 5, the connector 20 includes a series of springs 36 which fit into the grooves 34 and extend across the front face 32 of the connector 20 in contact with the surface of the daughter card 14. These springs, shown as coil springs, may be of the canted coil variety, a reference being made to U.S. Pat. No. 4,969,824 for a description of canted coil spring structures. It is contemplated that other spring means may be provided to drive contacts in a manner to be described to effect an adequate normal bearing force between contacts being interconnected.

While the grooves 34 are illustrated as having sharp, 90° corners between the base and side walls thereof, such corners may be chamfered or filleted, as desired. A typical spring 36 is oval configured, with a width of about 0.078 inches, a height of about 0.070 inches, and a wire gauge of about 0.006 inches.

The mating edges 40 of the bottom face 30 and front face 32 are sawtoothed configured 42 at an angle of about 45°. Further, the internal housing segments 22, i.e. those segments sawtoothed along both the outside edges 40, are identical such that the groove extension 44 on one edge will intermate or be received within the recess 46 along the side of an adjacent housing module. By this arrangement, as best seen in FIG. 4, adjacent grooves 34 are oppositely angled, namely about 90° to one another for a preferred embodiment.

FIG. 5 illustrates the manner by which the springs 36 are oriented within the respective grooves 34. It will be noted that the convolutions of the springs are arranged to cross the gap 50, at an angle of about 90°, to thereby avoid the problems associated with the prior art. While an obvious solution would have been to eliminate the gaps by providing a continuous housing, the modular concept allows for the selection of different sized connector to receive a variety of PCBs. However, by accepting that flexibility, performance problems arose. It will be appreciated that with a gap width of from 0.005 to 0.010 inches, and a typical wire gauge of 0.006 inches, such wire can become trapped in the gap affecting the spring's performance. By arranging the springs in the manner illustrated in FIG. 5, the wire trapping problem is eliminated.

Figure 2:
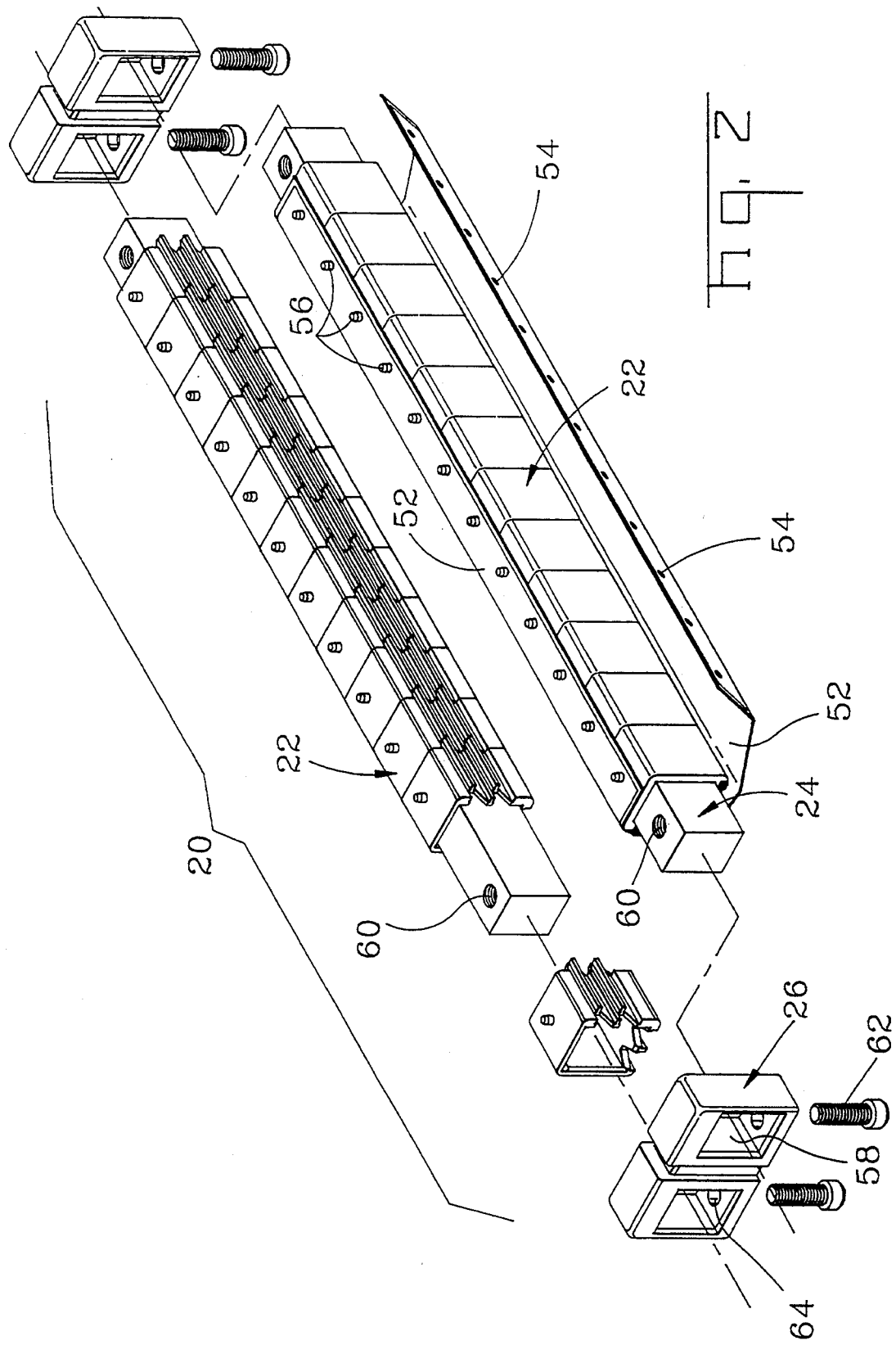
FIG. 2 is an exploded, perspective view of the connector housing utilizing the intermatable housing segments according to this invention.

The purpose of the springs 36 is to provide a normal force to an overlying flexible film 52 on which circuit traces or pads are arranged to electrically interconnect with corresponding traces or pads on the mother board 10 and daughter board 12, as known in the art. FIG. 2 illustrates one of the housing members as having a flexible film 52 partially wrapped about a housing member. The film 52 may be secured thereabout by overlapping the film along the top, where plural aligned holes 54 in the film are received on plural projections 56, which in turn are heat staked, in a manner known in the art, to prevent premature removal of the film.

As best seen in FIG. 2, and as noted above, a pair of end housings 26 are provided to secure the connector 20 to the first of the two planar electronic devices, i.e. mother board, not shown in FIG. 2. The end housings 26 are rectangular in configuration, with a central opening 58, to receive the rigid central core member 24 at each end thereof. Such core members 24 are provided with threaded openings 60 to receive threaded members 62. Specifically, the end housings 26, along the base, include threaded openings 64 which are aligned with the threaded openings 60 in the core members. In this position, threaded members 62 are passed through openings (not shown) in the mother board, then threaded into the respective openings 60, 64. By this arrangement, and suitably spaced apart, the housing members are mounted to the mother board to receive and electrically engage the daughter board between the respective housing members.

I claim:

1. In a high density electrical connector for electrically interconnecting conductive paths between a pair of planar electronic devices, where the connector includes a pair of opposed housing members, each said housing member comprising a plurality of aligned housing segments, where said segments are characterized by a pair of end walls and at least a pair of planar sides containing plural, parallel grooves for receiving coiled springs therein, the improvement comprising in combination therewith the provision that said housing segments are arranged in end-to-end relationship such that said respective grooves are aligned to define a continuous groove between adjacent, aligned segments, and that said end walls are profiled to present a sawtoothed configuration which when arranged together interfit to form an essentially continuous planar side, whereby the end wall junction within a groove between adjacent said segments is angularly disposed relative to the axis of said grooves.

2. The high density electrical connector according to claim 1 wherein coiled springs are received in said grooves, where said springs act as a normal force generator to an overlying flexible film containing circuitry thereon to electrically interconnect with said paths on said planar electronic devices.

3. The high density electrical connector according to claim 2 wherein there are two housing members arranged in a parallel relationship to slidably receive one of said planar electronic devices therebetween.

4. The high density electrical connector according to claim 2 wherein said housing segments are rectangular in configuration and that grooves are provided along two adjoining walls thereof.

5. The high density electrical connector according to claim 2 wherein said housing segments are slidably arranged along a structural core, and said core includes means for securing said core and said contained segments to one of said planar electronic devices.

6. The high density electrical connector according to claim 5 wherein said means includes end caps, each having a threaded hole for engaging a threaded member inserted through said planar electronic device into said threaded hole.

7. The high density electrical connector according to claim 1 wherein the convolutions of said coiled springs are angularly oriented to the axis of said grooves, and said end walls within said grooves are transversely angled to the angle of said convolutions.

8. The high density electrical connector according to claim 7 where the convolutions of a given coiled spring are angled opposite to the convolutions of an adjacent coiled spring.

* * * * *